United States Patent
Doebler

(10) Patent No.: US 10,347,638 B2
(45) Date of Patent: Jul. 9, 2019

(54) METHOD OF FORMING CONTACTS FOR A MEMORY DEVICE

(71) Applicant: Micron Technology, Inc., Boise, ID (US)

(72) Inventor: Jonathan T. Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 351 days.

(21) Appl. No.: 15/050,328

(22) Filed: Feb. 22, 2016

(65) Prior Publication Data

US 2016/0172363 A1 Jun. 16, 2016

Related U.S. Application Data

(60) Continuation of application No. 13/674,254, filed on Nov. 12, 2012, now Pat. No. 9,337,053, which is a (Continued)

(51) Int. Cl.
| | |
|---|---|
| *H01L 27/108* | (2006.01) |
| *H01L 21/311* | (2006.01) |
| *H01L 21/768* | (2006.01) |
| *H01L 23/532* | (2006.01) |
| *H01L 23/535* | (2006.01) |

(52) U.S. Cl.
CPC .. *H01L 27/10814* (2013.01); *H01L 21/31144* (2013.01); *H01L 21/76802* (2013.01); *H01L 21/76831* (2013.01); *H01L 21/76897* (2013.01); *H01L 23/535* (2013.01); *H01L 23/53266* (2013.01); *H01L 27/10855* (2013.01); *H01L 27/10888* (2013.01); *H01L 2924/0002* (2013.01)

(58) Field of Classification Search
CPC ............ H01L 27/10814; H01L 23/535; H01L 23/53266; H01L 27/10888; H01L 27/10855; H01L 21/76897; H01L 21/76831; H01L 21/76802; H01L 21/31144; H01L 2924/0002
See application file for complete search history.

(56) References Cited

U.S. PATENT DOCUMENTS 5,066,606 A 11/1991 Lee
6,218,089 B1 4/2001 Pierrat
(Continued)

*Primary Examiner* — Karen Kusumakar
(74) *Attorney, Agent, or Firm* — Wells St. John P.S.

(57) ABSTRACT

The present invention is generally directed to a method of forming contacts for a memory device. In one illustrative embodiment, the method includes forming a layer of insulating material above an active area of a dual bit memory cell, forming a hard mask layer above the layer of insulating material, the hard mask layer having an original thickness, performing at least two partial etching processes on the hard mask layer to thereby define a patterned hard mask layer above the layer of insulating material, wherein each of the partial etching processes is designed to etch through less than the original thickness of the hard mask layer, the hard mask layer having openings formed therein that correspond to a digitline contact and a plurality of storage node contacts for the dual bit memory cell, and performing at least one etching process to form openings in the layer of insulating material for the digitline contact and the plurality of storage node contacts using the patterned hard mask layer as an etch mask.

20 Claims, 18 Drawing Sheets

Related U.S. Application Data division of application No. 12/892,684, filed on Sep. 28, 2010, now Pat. No. 8,329,534, which is a division of application No. 11/368,898, filed on Mar. 6, 2006, now Pat. No. 7,807,582.

(56) References Cited

U.S. PATENT DOCUMENTS

| | | |
|---|---|---|
| 6,429,474 B1 | 8/2002 | Gambino et al. |
| 6,548,347 B2 | 4/2003 | Juengling |
| 6,627,933 B2 | 9/2003 | Juengling |
| 6,777,260 B1 | 8/2004 | Chen |
| 6,844,694 B2 | 1/2005 | Juengling |
| 2005/0104090 A1* | 5/2005 | Juengling ......... H01L 27/10873 257/211 |
| 2005/0186802 A1 | 8/2005 | Busch et al. |
| 2005/0277276 A1 | 12/2005 | Stephens et al. |
| 2006/0131632 A1* | 6/2006 | Chae ................. H01L 27/10852 257/300 |
| 2006/0189063 A1 | 8/2006 | Hueting et al. |
| 2007/0207620 A1* | 9/2007 | Doebler ............ H01L 21/31144 438/712 |
| 2007/0264838 A1* | 11/2007 | Krishnan .......... H01L 27/10852 438/758 |
| 2008/0237714 A1* | 10/2008 | Fazan .................... H01L 21/84 257/347 |

* cited by examiner

METHOD OF FORMING CONTACTS FOR A MEMORY DEVICE

RELATED PATENT DATA

This patent is a continuation of and claims priority to U.S. patent application Ser. No. 13/674,254 filed Nov. 12, 2012, which is a divisional of and claims priority to U.S. patent application Ser. No. 12/892,684, filed Sep. 28, 2010, now U.S. Pat. No. 8,329,534, which is a divisional of and claims priority to U.S. patent application Ser. No. 11/368,898 filed Mar. 6, 2006, now U.S. Pat. No. 7,807,582, the disclosures of which are incorporated by reference.

BACKGROUND OF THE INVENTION

1. Field of the Invention

The present invention is generally related to the field of manufacturing integrated circuit devices, and, more particularly, to a method of forming contacts for a memory device.

2. Description of the Related Art

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is made up of memory cells. Each cell of a modern DRAM includes a transistor and a capacitor, where the capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

Referring to FIG. 1, a schematic diagram of an illustrative DRAM memory cell 10 is depicted. The cell 10 is illustrated as having a capacitor 12 and an access transistor 14. The capacitor 12 is used to store a charge. The charge represents a bit of information. The access transistor 14 acts as a switch for the capacitor 12. That is, the access transistor 14 controls when a charge is placed on the capacitor 12, and when a charge is discharged from the capacitor 12. A word line 16 is coupled to a control gate of the access transistor 14. When a cell is read, the word line 16 activates the control gate of the transistor 14. Once this happens, any charge (or lack of charge) stored on the capacitor 12 is shared with a conductive digitline 18 coupled to the drain of the access transistor 14. This charge is then detected in the digitline 18 by a sense amplifier (not shown) and then processed to determine the bit state of the cell 10. Tiling a selected quantity of cells 10 together, such that the cells 10 along a given digitline 18 do not share a common word line 16 and the cells 10 along a common word line 16 do not share a common digitline 18, forms a memory array. A typical memory array contains thousands or millions of cells 10.

A simplified block diagram of a prior art DRAM 20 is described in FIG. 2. The memory device can be coupled to a processor 32 for bi-directional data communication. The memory includes an array of DRAM memory cells 22. Control circuitry 28 is provided to manage data storage and retrieval from the array 22 in response to control signals from the processor 32. Address circuitry 26, X-decoder 26a and Y-decoder 26b analyze address signals and storage access locations of the array 22. Sensing circuitry 24 is used to read data from the array 22 and couple output data to I/O circuitry 30. The I/O circuitry 30 operates in a bi-directional manner to receive data from the processor 32 and pass this data to array 22. Of course, those skilled in the art will understand that the illustrative circuitry depicted in FIG. 2 does not include all of the circuitry of a functioning DRAM.

The manufacture of memory devices, particularly DRAMs, is a very competitive industry. Thus, process engineers are faced with continuous pressure to become ever more efficient in the processing techniques and methods used to form such devices. In general, manufacturing a DRAM device involves the performance of many individual process steps. For example, multiple deposition, cleaning, etching, ion implantation, polishing and heating processes are typically performed in a precise order to produce a DRAM device. Such processes typically involve the use of very complex processing tools that are very expensive to maintain and use.

During the formation of memory devices, several conductive connections must be made to device features formed in and above a semiconducting substrate. Conductive connections that couple a conductive metal line to a device formed in or above the substrate, or ones that are coupled to the substrate itself are sometimes referred to as contacts. Conductive connections between layers of conductive lines that are positioned in layers of insulating material are sometimes referred to as vias. For example, in a DRAM array 22 having a dual bit memory cell structure, a so-called digitline contact is provided between a digitline and an access device, e.g., a transistor, formed in or above a substrate. So-called storage node contacts are formed between the access transistor and a capacitor or storage node where electrical charge may be stored. Additionally, there are many contacts that must be formed to other semiconductor devices, e.g., transistors, resistors, capacitors, that are used to form contacts in areas of the DRAM outside of the memory array 22. For example, contacts must be formed to the semiconductor devices that comprise the sensing circuitry 24 as well as other circuits located outside of the array 22, i.e., the non-array circuitry.

In a typical process flow used to form a DRAM, contacts formed within the array 22 are formed at a different time relative to the formation of contacts to circuits outside of the array 22. Thus, although the precise methodology of forming the contacts may involve similar steps, the process steps are performed at different points in time during the course of manufacturing the device. Additionally, the formation of a digitline contact and the storage node contacts is generally formed by performing a sequence of process steps that typically involves several polishing steps wherein an upper surface of the gate electrode for the access transistor is used as a polishing stop surface in a chemical mechanical polishing (CMP) process. Since the upper surface of the gate electrode is frequently covered with a layer of silicon nitride (a "nitride cap"), such processing steps are sometimes referred to as stop-on-nitride (SON) polishing techniques. In the case of a DRAM with a buried access device, CMP processes may lead to dishing within the array 22 which, in turn, may lead to problems with future photolithography processes. When performing such a CMP process on a DRAM with non-buried access devices, it is generally preferable to remove the nitride cap on the gate electrodes outside of the array 22 by using a photolithography step to protect the array 22. Typically, contacts inside the array 22 are filled with polysilicon and contacts outside of the array 22 are filled with a metal, such as tungsten.

What is needed is a more efficient methodology for forming contacts on DRAMs. The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of forming contacts for a memory device. In one illustrative embodiment, the method comprises forming a layer of insulating material above an active area of a dual bit memory cell, forming a hard mask layer above the layer of insulating material, the hard mask layer having an original thickness, performing at least two partial etching processes on the hard mask layer to thereby define a patterned hard mask layer above the layer of insulating material, wherein each of the partial etching processes is designed to etch through less than the original thickness of the hard mask layer, the hard mask layer having openings formed therein that correspond to a digitline contact and a plurality of storage node contacts for the dual bit memory cell, and performing at least one etching process to form openings in the layer of insulating material for the digitline contact and the plurality of storage node contacts using the patterned hard mask layer as an etch mask.

In another illustrative embodiment, the method comprises forming a layer of insulating material above an active area of a dual bit memory cell, forming a hard mask layer above the layer of insulating material, the hard mask layer having an original thickness, performing at least two partial etching processes on the hard mask layer to thereby define a patterned hard mask layer above the layer of insulating material, wherein each of the partial etching processes is designed to etch through less than the original thickness of the hard mask layer, the patterned hard mask layer being comprised of a material that is selectively etchable with respect to the layer of insulating material, the patterned hard mask layer having openings formed therein that correspond to a digitline contact and a plurality of storage node contacts for the dual bit memory cell, and performing a single etching process to form openings in the layer of insulating material for the digitline contact and the plurality of storage node contacts using the patterned hard mask layer as an etch mask.

In yet another illustrative embodiment, the method comprises forming a layer of insulating material above an active area of a dual bit memory cell, depositing a hard mask layer above the layer of insulating material, the hard mask layer having a deposited thickness, performing at least two partial etching processes on the deposited hard mask layer to form a patterned hard mask layer, wherein each of the partial etching processes is designed to etch through less than the entire deposited thickness of the hard mask layer, the hard mask layer having openings formed therein that correspond to a digitline contact and a plurality of storage node contacts for the dual bit memory cell, and performing at least one etching process to form openings in the layer of insulating material for the digitline contact and the plurality of storage node contacts using the patterned hard mask layer as an etch mask.

In a further illustrative embodiment, the method comprises forming a layer of insulating material above an active area of a dual bit memory cell, forming a patterned hard mask layer above the layer of insulating material, the patterned hard mask layer being comprised of a material that is selectively etchable with respect to the layer of insulating material, the hard mask layer having openings formed therein that correspond to a digitline contact, a plurality of storage node contacts for the dual bit memory cell and an opening for a contact located in a peripheral circuit located outside of a memory array comprising the dual bit memory cell, and performing a single etching process to form openings in the layer of insulating material for the digitline contact, the plurality of storage node contacts and the contact for the peripheral circuit using the patterned hard mask layer as an etch mask.

In yet a further illustrative embodiment, the method comprises forming a plurality of word line structures, forming a digitline contact, at least a portion of which is positioned between the word line structures, forming a plurality of storage node contacts, each of which comprises a portion that is positioned between one of the word line structures and a passing word line structure, and forming a liner comprising a low-k dielectric material having a dielectric constant less than 7 adjacent at least a portion of a side of each of the storage node contacts.

In still a further illustrative embodiment, the method comprises forming a plurality of word line structures, forming a digitline contact, at least a portion of which is positioned between the word line structures, forming a plurality of storage node contacts comprising a unitary conductive structure, each of the storage node contacts comprising a portion that is positioned between one of the word line structures and a passing word line structure, and forming a liner comprising a low-k dielectric material having a dielectric constant less than 7 adjacent at least a portion of a side of the unitary conductive structures.

In still another illustrative embodiment, the method comprises forming a plurality of word line structures, forming a digitline contact, at least a portion of which is positioned between the word line structures, forming a plurality of storage node contacts comprising a first conductive portion and a second conductive portion, the first conductive portion being in direct contact with a semiconducting substrate, the second conductive portion being positioned above the first conductive contact, wherein there is a conductive interface between the first and second conductive portions, the first conductive portion comprising a portion that is positioned between one of the word line structures and a passing word line structure, and forming a liner comprising a low-k dielectric material having a dielectric constant less than 7 adjacent at least a portion of a side of the second conductive portions.

In one illustrative embodiment, the device comprises a plurality of word line structures, a digitline contact, at least a portion of which is positioned between the word line structures, a plurality of storage node contacts, each of which comprises a portion positioned between one of the word line structures and an adjacent passing word line structure, and a liner comprising a low-k dielectric material having a dielectric constant less than 7 positioned adjacent at least a portion of a side of each of the storage node contacts.

In another illustrative embodiment, the device comprises a plurality of word line structures, a digitline contact, at least a portion of which is positioned between the word line structures, a plurality of storage node contacts comprising a unitary conductive structure, each of the storage node contacts comprising a portion positioned between one of the word line structures and an adjacent passing word line structure, and a liner comprising a low-k dielectric material having a dielectric constant less than 7 positioned adjacent at least a portion of a side of the unitary conductive structure.

In yet another illustrative embodiment, the device comprises a plurality of word line structures, a digitline contact, at least a portion of which is positioned between the word line structures, a plurality of storage node contacts comprising a first conductive portion and a second conductive portion, the first conductive portion being in direct contact with a semiconducting substrate, the second conductive portion being positioned above the first conductive contact, wherein there is a conductive interface between the first and second conductive portions, the first conductive portion being positioned between one of the word line structures and an adjacent passing word line structure, and a liner comprising a low-k dielectric material having a dielectric constant less than 7 positioned adjacent at least a portion of a side of the second conductive portions.

BRIEF DESCRIPTION OF THE DRAWINGS

The invention may be understood by reference to the following description taken in conjunction with the accompanying drawings, in which like reference numerals identify like elements, and in which.

Figure 1:
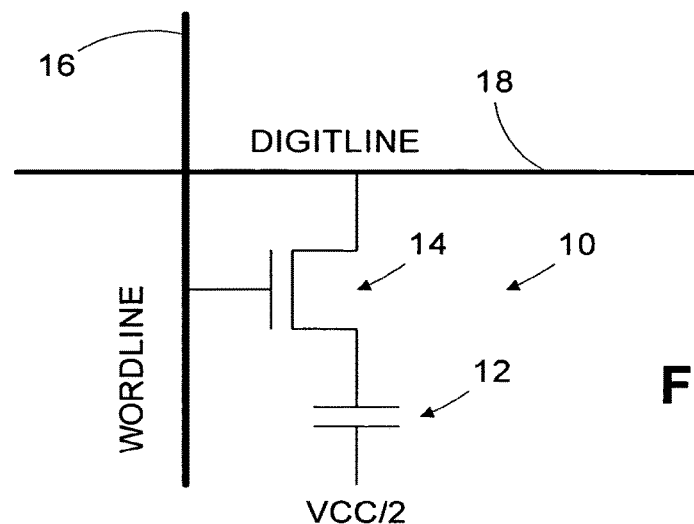
FIG. 1 is an illustrative simplified schematic depiction of a DRAM cell.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3:
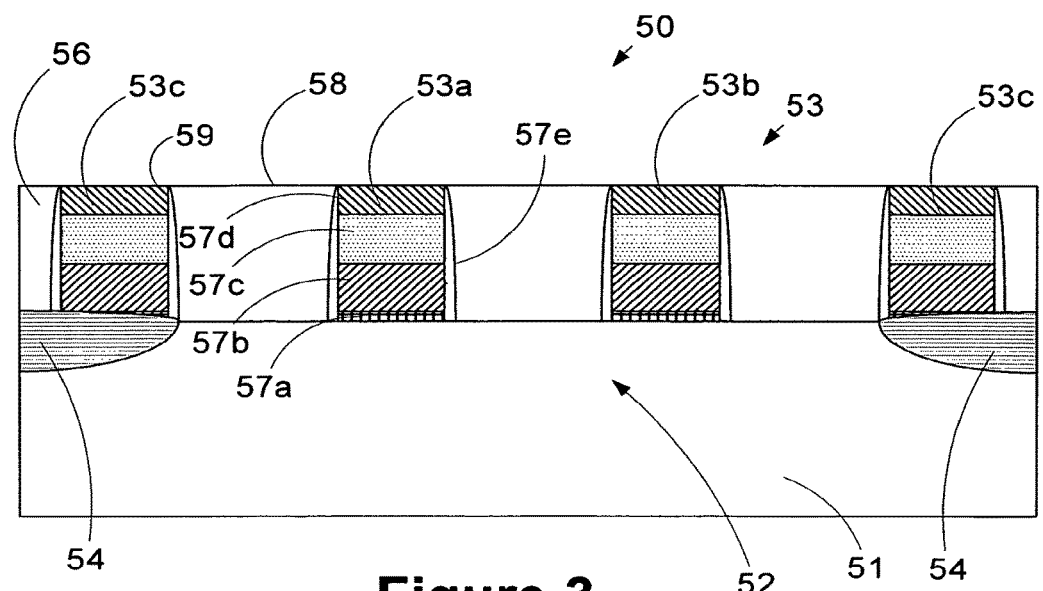
FIG. 3 depicts a partially formed memory devices in accordance with one aspect of the present invention.

As will be recognized by those skilled in the art, FIG. 3 depicts a portion of an illustrative memory cell 50 formed above a portion of a substrate 51 at an intermediate stage of manufacture for an illustrative DRAM device. The present invention is disclosed in the context of manufacturing an illustrative DRAM device. However, as those skilled in the art will recognize after a complete reading of the present application, the present invention is not limited to the manufacture of such devices, as other types of devices may be manufactured using the methods and techniques disclosed herein.

As shown in FIG. 3, the memory cell 50 comprises a plurality of isolation regions 54, and an active area 52. Also depicted in FIG. 3 are a plurality of access devices 53 (designated as 53a and 53b), e.g., word lines, and a plurality of passing word lines 53c. As will be understood by those skilled in the art, the access devices 53 may be "buried" type devices that are formed in the substrate 51, or they may be more traditional unburied access devices that are formed above the surface of the substrate 51. In the illustrative examples depicted herein, the access devices 53 are depicted as unburied access devices. Of course, the present invention may be employed with both buried and unburied access devices. Moreover, the exact configuration of the access devices 53 may also vary and should not be considered a limitation of the present invention. For example, the access devices 53 may comprise a gate insulating layer 57*a*, a conductive layer 57*b*, a metal silicide layer 57*c*, a top insulating layer 57*d*, such as, for example, a layer of silicon nitride, and a sidewall spacer 57*e*.

FIG. 3 also depicts a first insulating layer 56 formed above the substrate 51. The first insulating layer 56 may be comprised of a variety of materials, e.g., silicon dioxide, BPSG, etc. The first layer of insulating material 56 may be formed by performing any of a variety of known deposition processes, e.g., chemical vapor deposition (CVD), plasma enhanced chemical vapor deposition (PECVD), etc. Typically, the first layer of insulating material 56 will be deposited such that its surface 58 extends above the surface 59 of the access devices 53. Depending upon the planarity of the surface 59 of the as-deposited layer 56, additional planarization processes, e.g., chemical mechanical polishing (CMP) process, may not need to be performed on the surface 58 of the layer 56. In the illustrative embodiment depicted in FIG. 3, a CMP process has been performed to planarize the surface 58 thereby making the surface 58 of the first insulating layer 56 substantially planar with the surface 59 of the access devices 53.

Figure 4:
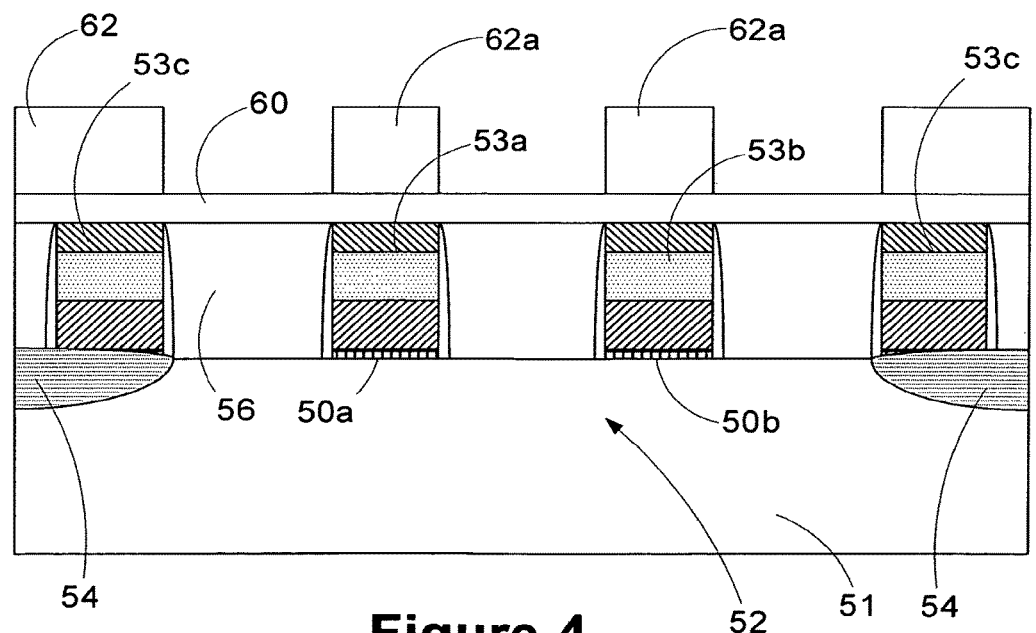
FIG. 4 depicts the structure of FIG. 3 with a hard mask layer and a first masking layer formed thereabove.
Figure 5:
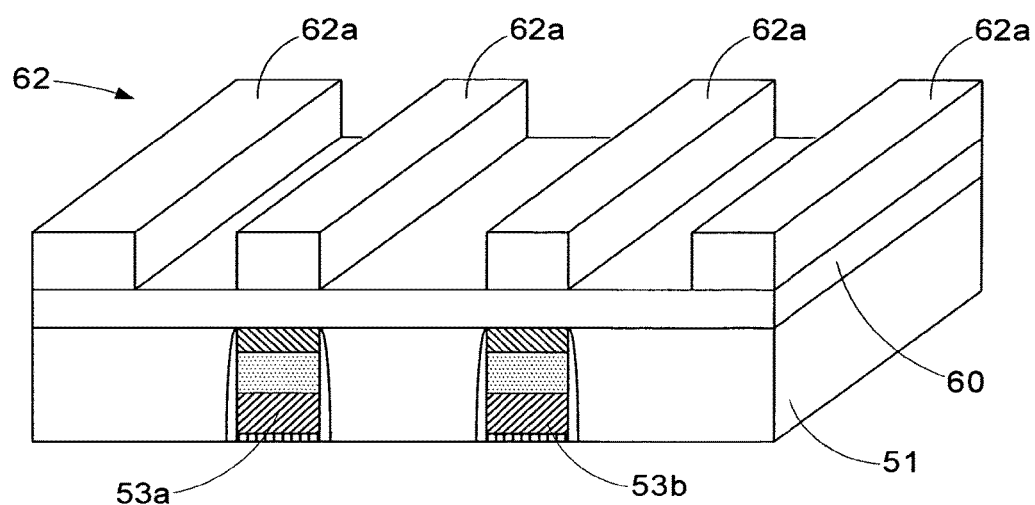
FIGS. 5-7 depict an illustrative embodiment of a first partial etching of the hard mask layer.
Figure 6:
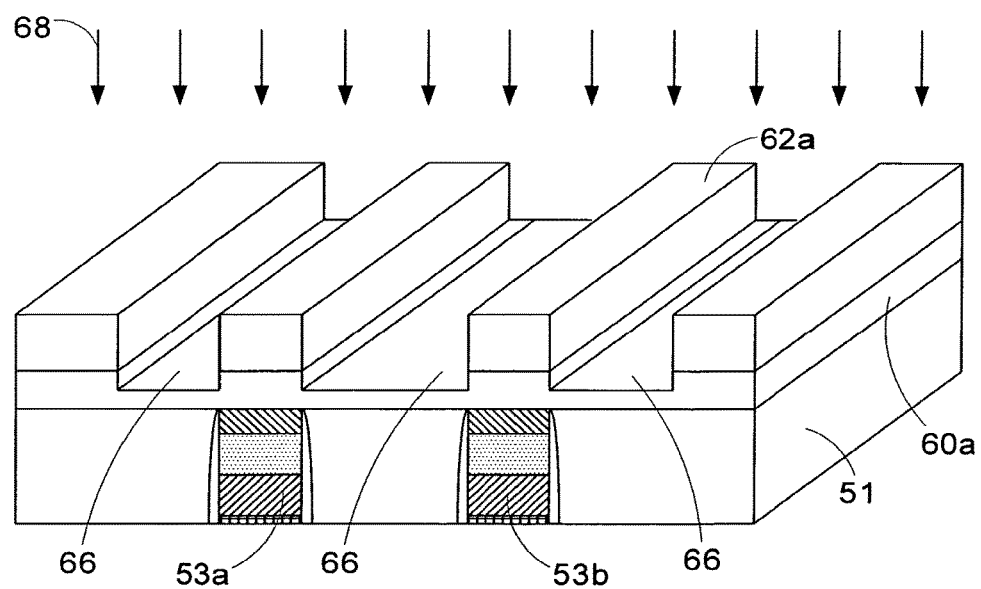
Figure 7:
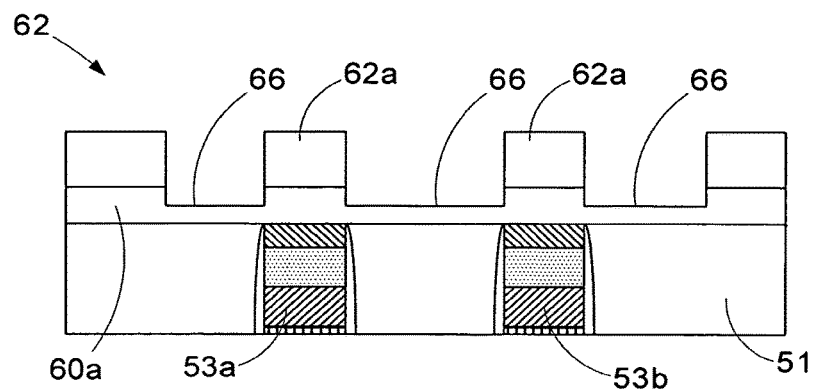

Next, as shown in FIG. 4, a hard mask layer 60 is deposited above the structure depicted in FIG. 3. The hard mask layer 60 may be comprised of a variety of materials, and it may perform a variety of functions. As described more fully below, the hard mask layer 60 will ultimately be patterned and used as an etch mask in defining openings in the first insulating layer 56 for conductive contacts for the finished device. The hard mask layer 60 may also serve other purposes, e.g., it may act as an anti-reflective coating layer. Thus, in prior art processing methodologies, the hard mask layer 60 may be referred to as a DARC (which may refer to a deposited anti-reflective coating or a dielectric anti-reflective coating). The hard mask layer 60 may be comprised of a variety of materials, other than photoresist materials, and it may be formed using a variety of techniques. Moreover, the thickness of the hard mask layer 60 may vary depending upon the particular application. In general, the hard mask layer 60 is comprised of a non-photoresist material that is selectively etchable with respect to the underlying insulating layer 56. Illustrative materials for the hard mask layer 60 include, for example, silicon nitride, silicon oxynitride, carbon, etc. The hard mask layer 60 may be formed by, for example, performing a CVD process, and it may have any desired thickness, e.g., 700-2000 Å. Thus, particular details of the illustrative hard mask layer 60 depicted herein should not be considered a limitation of the present invention.

As will be described with reference to FIGS. 4-11, the hard mask layer 60 will be patterned by performing first and second partial etching processes using first and second masking layers 62, 64. The first and second masking layers 62, 64 may be comprised of a variety of materials, e.g., photoresist. As will be recognized by those skilled in the art after reading the present application, the order in which the masking layers 62, 64 and the associated etching processes are described herein may be reversed.

FIGS. 4-9 will now be discussed. For purposes of clarity, not all aspects of the illustrative memory cell 50 will be shown in these drawings so as to not obscure the present invention. The first patterned masking layer 62 is formed such that its features 62*a* are parallel to and are positioned above the access devices 53. A first etching process, such as an anisotropic etching process, as indicated by the arrows 68, is performed to partially etch the hard mask layer 60, thereby defining recesses 66, e.g., trenches, in the hard mask layer 60. Note that the etching process is controlled such that the trenches 66 formed during this first etching process do not extend through the partially etched hard mask layer 60*a*. Typically, the first etching process may be performed such that the trenches 66 have a depth that equals approximately one-half of the starting thickness of the hard mask layer 60.

Thereafter, the first masking layer 62 is removed, and the second masking layer 64 (see FIGS. 8 and 9) is formed above the partially patterned hard mask layer 60*a*. The second masking layer 64 may also be comprised of a variety of materials, e.g., a photoresist material. The second masking layer 64 is formed such that its features 64*a* are substantially perpendicular to the features 62*a* of the first masking layer 62. In this illustrative example, the features 64*a* of the second masking layer 64 are also substantially perpendicular to the access devices 53, e.g., the word lines. As indicated above, the order and/or the orientation of the first and second masking layer 62, 64 may be reversed.

After the formation of the second masking layer 64, the partially etched hard mask layer 60*a* will be subjected to a second partial etching process, e.g., an anisotropic etching process, as indicated by the arrows 71. The second partial etching process 71 defines a plurality of trenches 69 (see FIG. 9) that are substantially perpendicular to the trenches 66 formed during the first partial etching process 68 (see FIG. 10). This second partial etching process, like the first partial etching process, is designed such that it will not etch through the entire original thickness of the hard mask layer 60. However, the portions of the hard mask layer 60*a* that are exposed to both the first and second partial etching processes will be removed, thereby defining a plurality of generally rectangular shaped openings 70 (e.g., 70*a*, 70*b*, 7*c*), thereby exposing the underlying first layer of insulating material 56.

Figure 8:
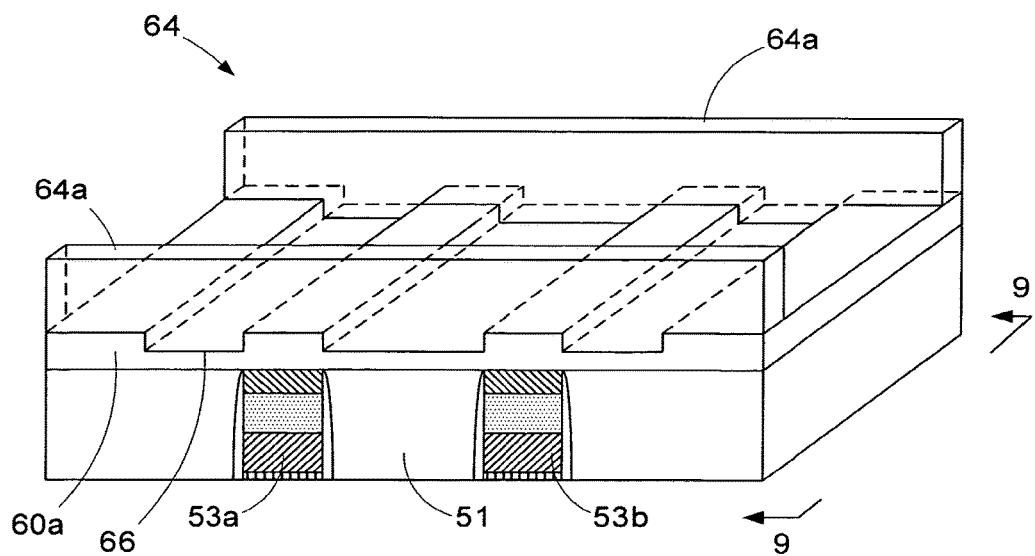
FIGS. 8-10 depict an illustrative embodiment of a second partial etching of the hard mask layer.
Figure 9:
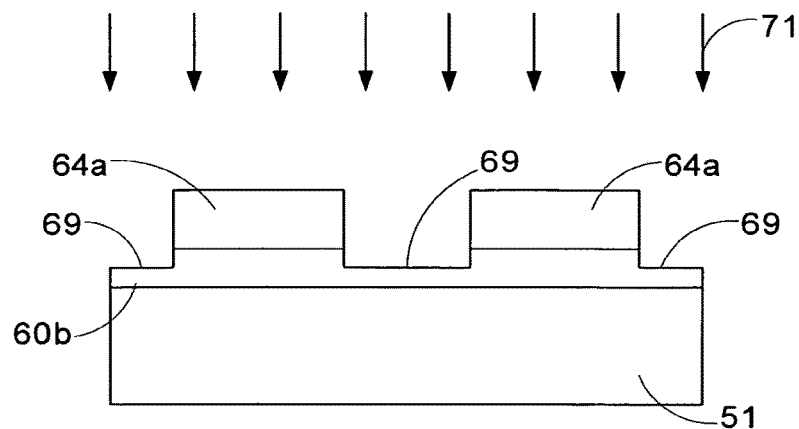
Figure 10:
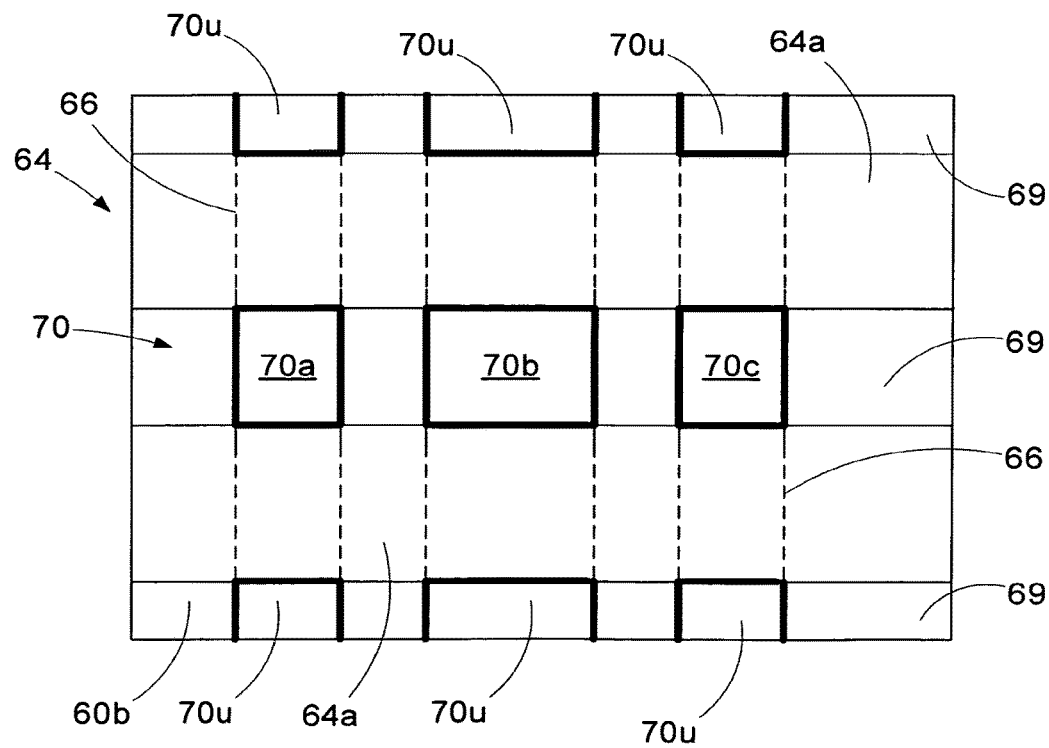
Figure 11:
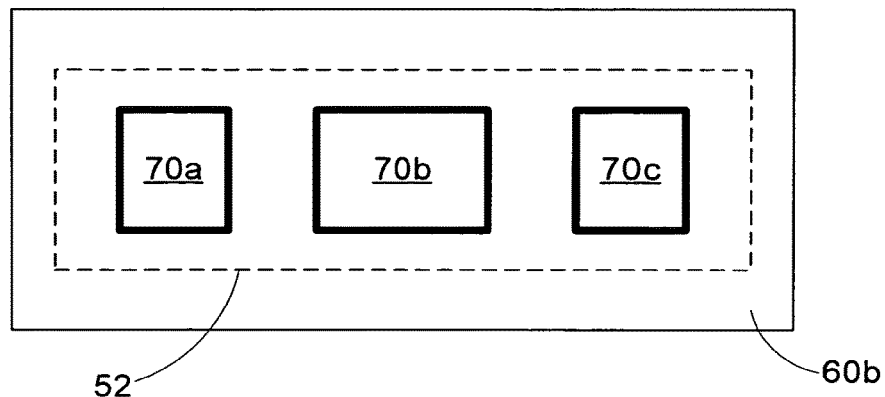
FIGS. 11-12 are plan views of an illustrative hard mask layer formed in accordance with one aspect of the present invention.

FIGS. 8 and 9 are, respectively, a perspective view and an end view depicting the patterned hard mask layer 60*b* after it has been subjected to the first and second partial etching processes described above. FIG. 10 is a plan view showing the masking layer 60*b* after it has been subjected to the two partial etching processes described above. FIG. 11 is a plan view of the patterned hard mask layer 60*b* with the openings 70*a*, 70*b* and 70*c* formed therein. For purposes of clarity, the associated trenches 66, 69 are not depicted in FIG. 11. Also note that an illustrative rectangular shaped active area 52 is depicted in dashed lines since it is positioned under the patterned hard mask layer 60*b*. As shown in the drawings, a plurality of openings 70 (designated as 70*a*, 70*b* and 70*c*) are formed in the patterned hard mask layer 60*b*. Note that the openings 70 are generally rectangular or square in shape due to the methodologies employed herein. However, by referring to the openings 70 as having a generally or substantially rectangular or square shape, precise geometric precision is not intended. As will be understood by those skilled in the art, precise geometric precision in the formation of such features is very difficult to achieve. Also note that a plurality of openings 70*u* for adjacent memory cells are also partially shown in FIG. 10.

Figure 12:
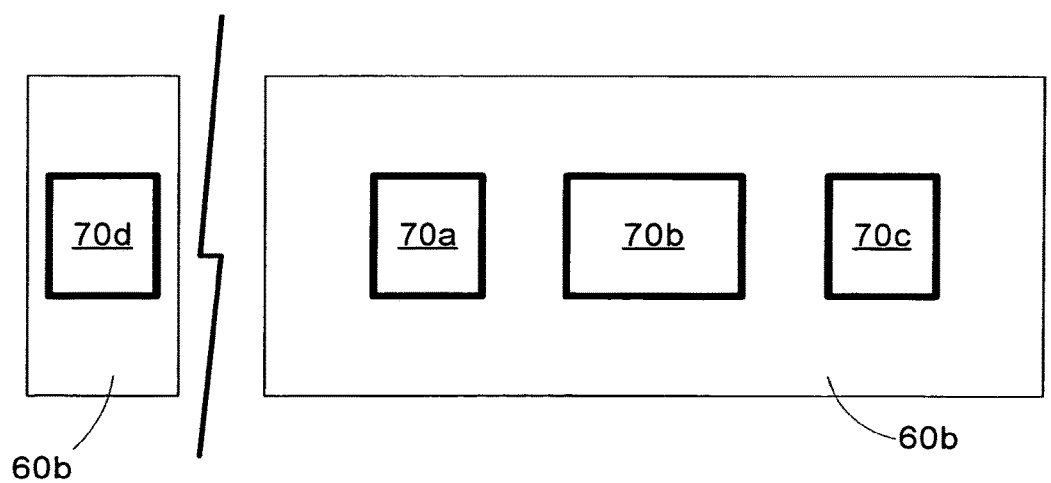

FIG. 12 is directed to an alternative embodiment wherein contact openings may be formed in the patterned hard mask layer 60*b* for contacts to be formed within the memory array and for contacts formed outside of the memory array, e.g., in some of the peripheral circuitry. As shown therein, an opening 70*d* for a contact to be formed outside of the array may be formed in the hard mask layer 60b at the same time the openings for contacts within the array, e.g., openings 70a, 70b and 70c, are formed in the hard mask layer 60b. It should be understood that the opening 70d is representative in nature in that it may represent a plurality of openings formed in the area outside of the array. The size of the openings 70d and 70a, 70b and 70c may vary depending on the particular application.

Figure 2:
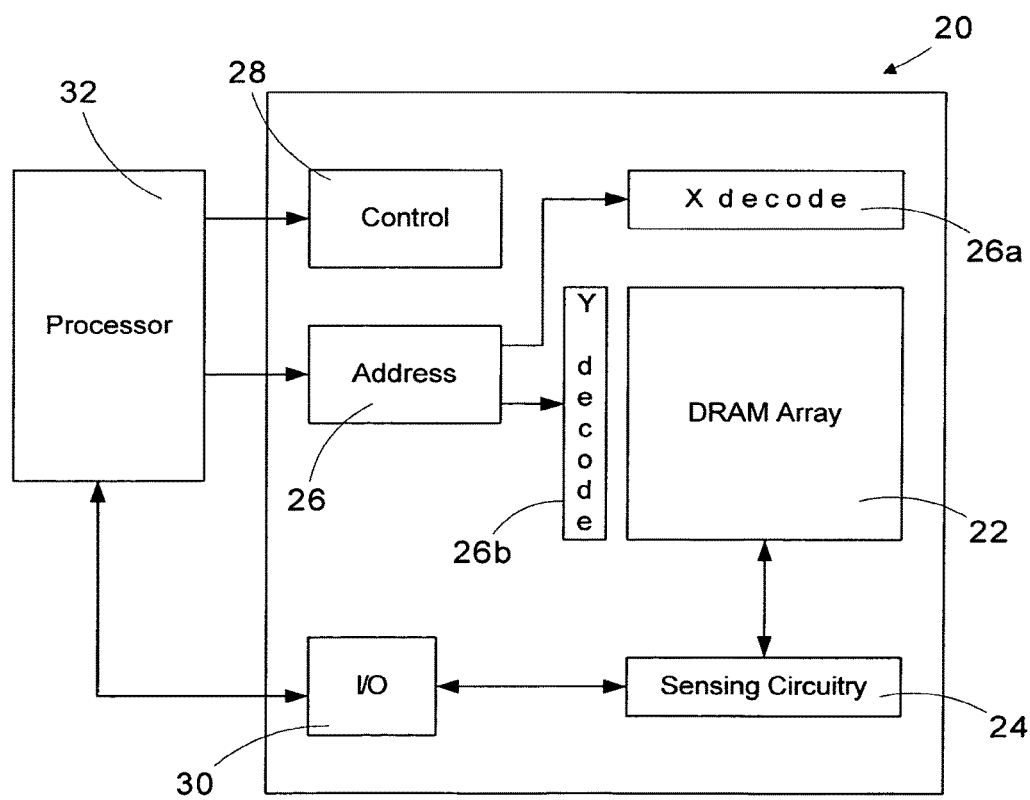
FIG. 2 is an illustrative schematic depiction of an illustrative DRAM device and its associated circuitry.

As described with respect to FIG. 2, a DRAM device is comprised of an array of memory cells 22 and a vast variety of peripheral circuitry, e.g., addressing circuitry 26, sensing circuitry 24, etc. Many of these peripheral circuits are formed in portions of the substrate at locations spaced apart from memory array 22. These peripheral circuits also comprise active devices, e.g., transistors, capacitors, resistors, etc., that require the formation of conductive contacts. In prior art process flows, the formation of the conductive contacts to the peripheral circuits was done at a different point in time in the process flow relative to the formation of the conductive contacts within the memory array 22. Obviously, such a methodology involved the performance of many additional process steps relative to the present invention wherein conductive contacts in both the memory array and conductive contacts outside of the memory array, e.g., in the peripheral circuits, can be formed at the same time. Thus, the present invention may result in less process steps, thereby improving manufacturing efficiency and reducing costs. The present invention may also remove various processing constraints, such as the SON CMP process discussed above. The present invention may enable the generation of additional process flows which may be more efficient.

Figure 13:
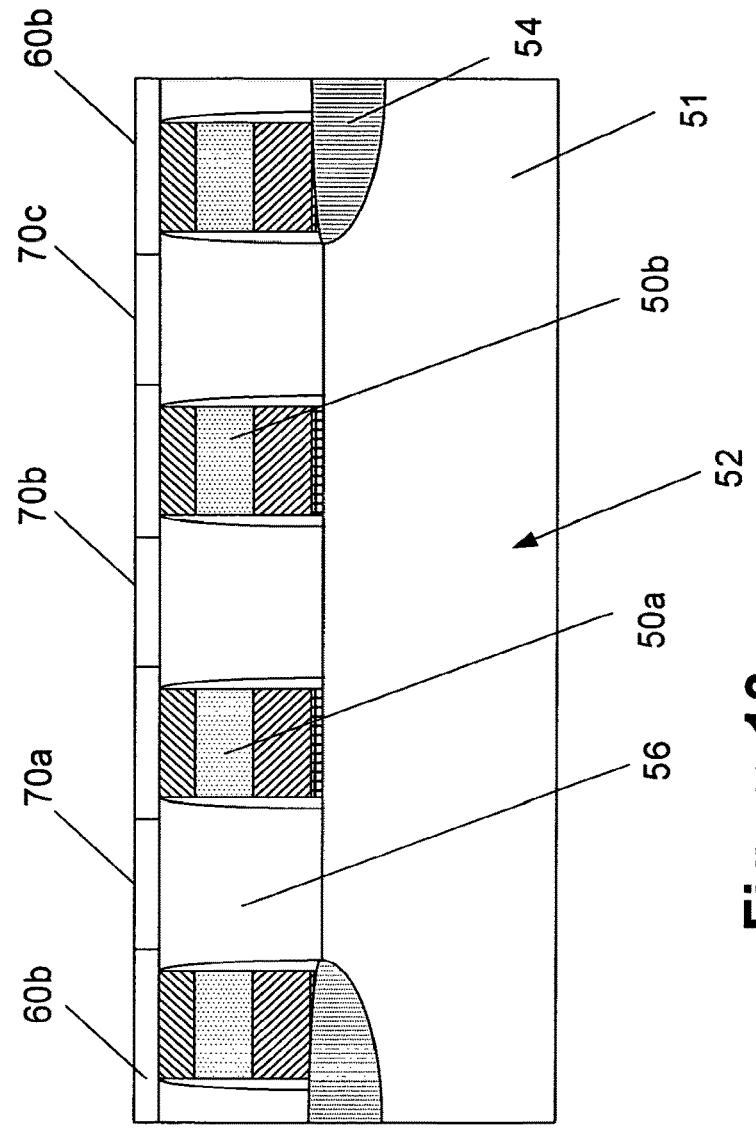
FIGS. 13-14 are cross-sectional side views depicting an illustrative example of using the patterned hard mask layer described herein to form discrete contact openings for a device.
Figure 13:
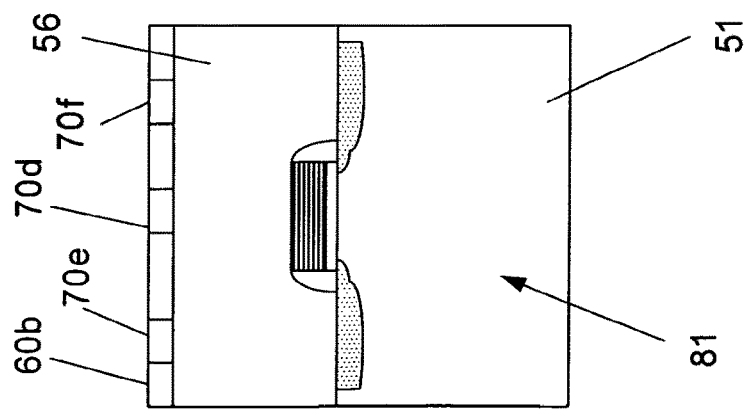
Figure 14:
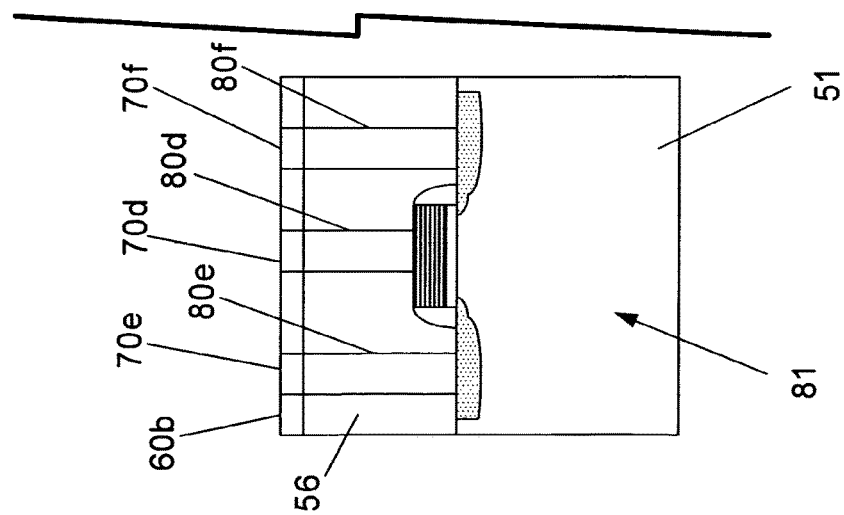
Figure 14:
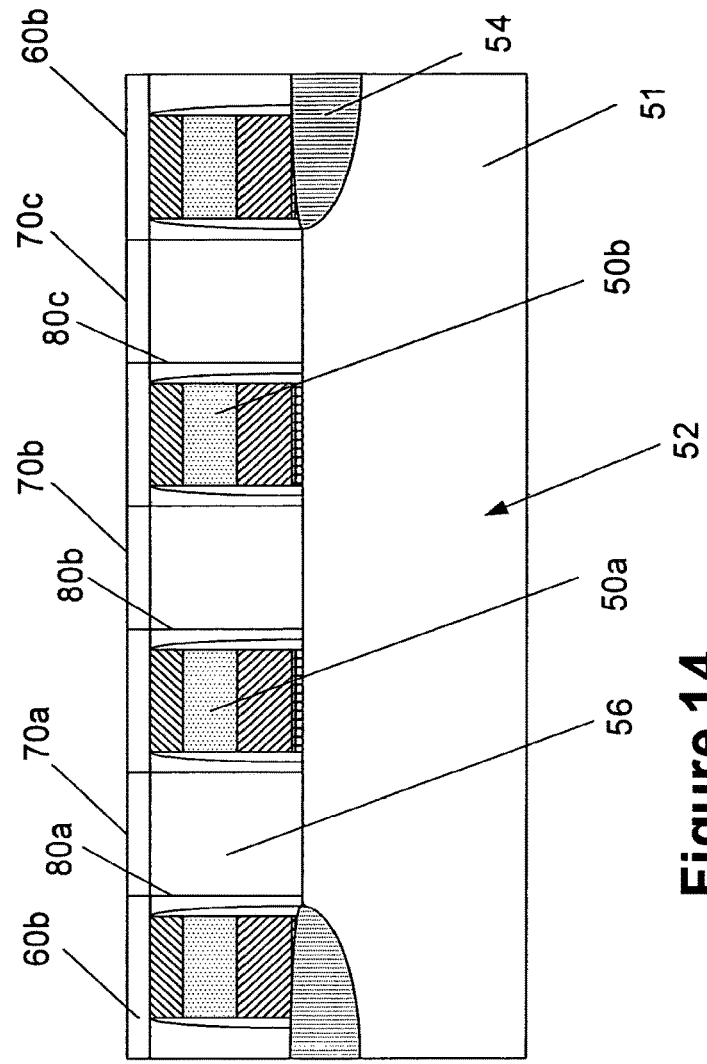

After the patterned hard mask layer 60b is formed, it may be used as a mask in an etching process to form discrete contact openings in the memory array and in the regions outside of the memory array if desired. As shown in FIGS. 13 and 14, the patterned hard mask layer 60b with openings 70a, 70b and 70c (without the array) and 70d, 70e and 70f (outside of the array) formed therein is used as a mask in an etching process that is used to form contact openings 80a, 80b and 80c (within the array) and 80d, 80e and 80f (outside of the array). An illustrative device 81, e.g., a transistor, is depicted as part of a circuit located outside of the memory array that contains the memory cells. Of course, the present invention is not limited to use in situations where contact openings are formed both inside and outside of the memory array at the same time. That is, contact openings within the array and outside of the array may be formed at different times. In the illustrative example depicted herein, a digitline contact will be formed in the opening 80b, storage node contacts will be formed in openings 80a, 80c and contacts for the gate electrode and source/drain regions of the transistor 81 in the peripheral circuit will be formed in the openings 80d, 80e and 80f. The precise methodology and techniques used to form the actual contacts may vary depending upon the application.

Obviously, the openings 80a, 80b, 80c, 80d, 80e and 80f will have the general shape as that of the openings 70a, 70b, 70c, 70d, 70e and 70f in the patterned hard mask layer 60b, i.e., substantially rectangular or substantially square. Note that the openings 80a, 80b, 80c in the memory array, and openings 80e and 80f extend all the way to the active area 52. The opening 80d in the peripheral regions may extend all the way to the substrate 51 as well, or extend down to contact a device formed in the periphery region, such as a transistor, a resistor, a capacitor, etc.

Figure 15:
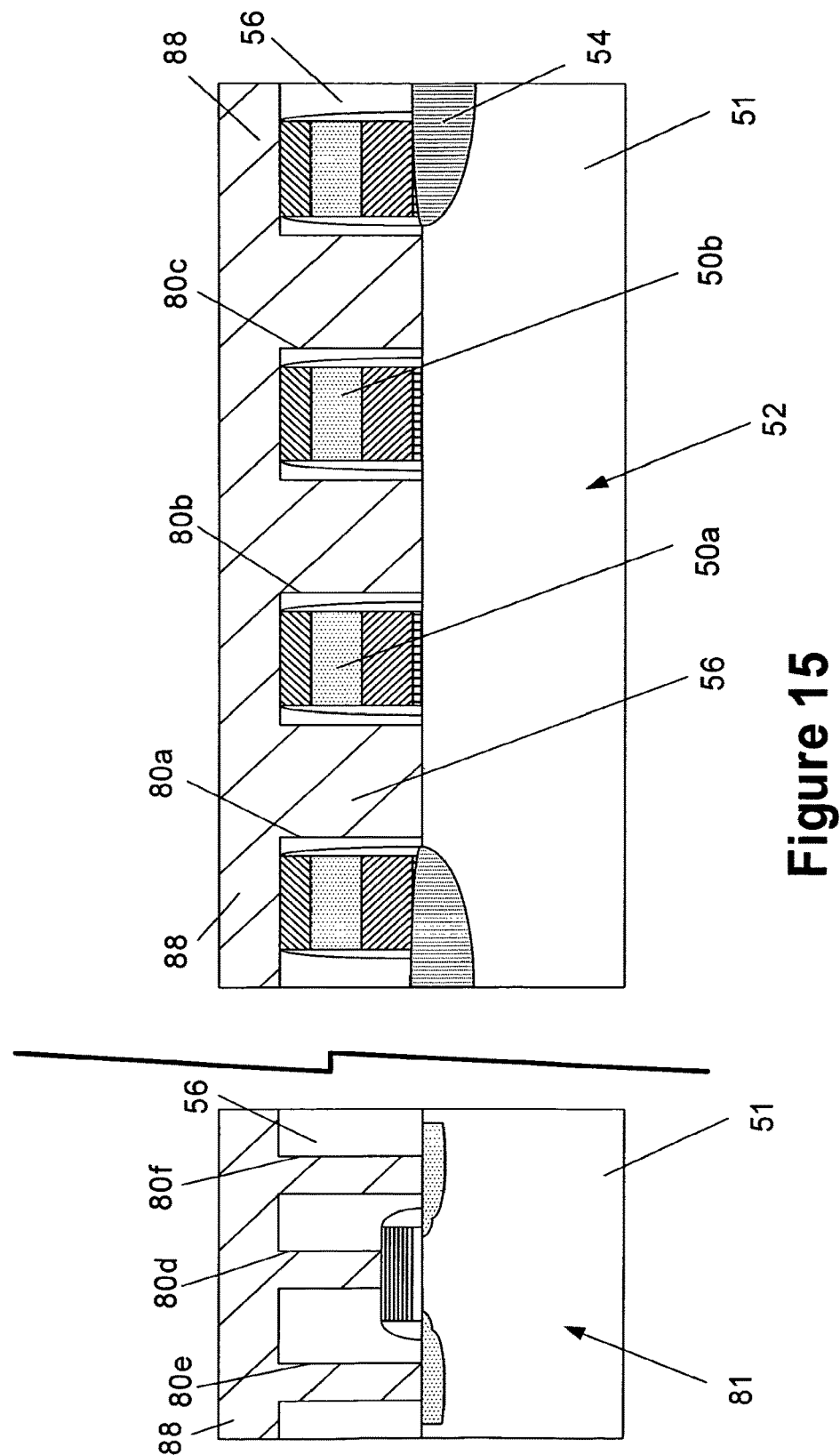
FIGS. 15-16 depict one illustrative process flow for filing contact openings formed in accordance with the present invention.
Figure 16:
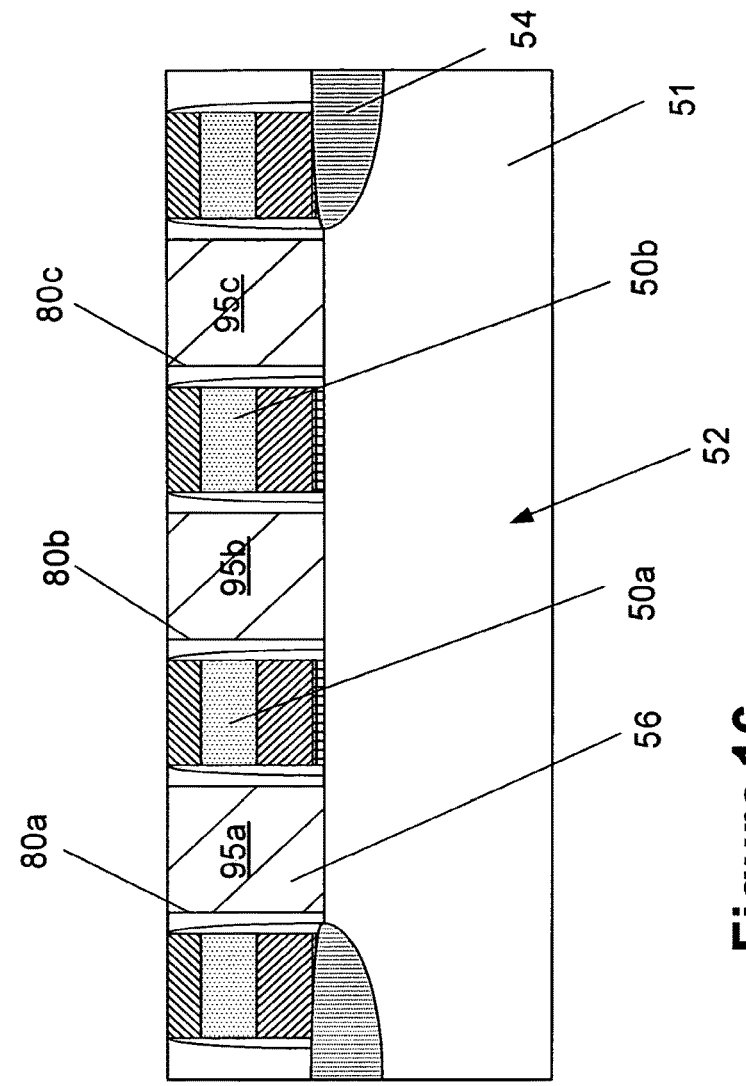
Figure 16:
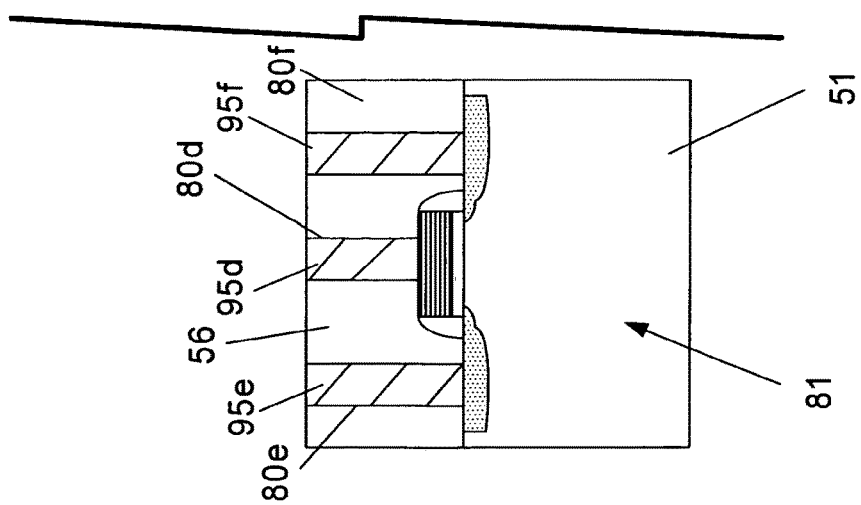

After the contact openings are formed using the patterned hard mask layer 60b, the openings in the insulating layer 56 may be filed with a conductive material, e.g., a metal, polysilicon, etc., using a variety of different process flows. After a complete reading of the present application, those skilled in the art will recognize that any of a variety of different process flows may be employed to form conductive material in the openings 80a, 80b, 80c, 80d, 80e and 80f. For example, as depicted in FIG. 15, a layer of conductive material 88, e.g., a metal such as tungsten, polysilicon, etc., is deposited across the substrate 51 and in the openings 80a, 80b, 80c, 80d, 80e and 80f. Thereafter, a planarization process, such as a chemical mechanical planarization process, is performed to remove excess portions of the conductive layer 88 that is positioned outside of the openings 80a, 80b, 80c, 80d, 80e and 80f. This results in the formation of conductive contacts 95a, 95b, 95c, 95d, 95e and 95f that extend down to the active area 22 and/or device 81 depending upon the contact under consideration. See FIG. 16. In one illustrative embodiment, the contact 95b is a digitline contact and the contacts 95a and 95c are storage node contacts for an illustrative dual bit memory cell 50. In one illustrative embodiment, the contact 95d is a contact to the gate electrode of the transistor 81 and the contacts 95e and 95f contact the source/drain regions of the transistor 81.

Figure 17:
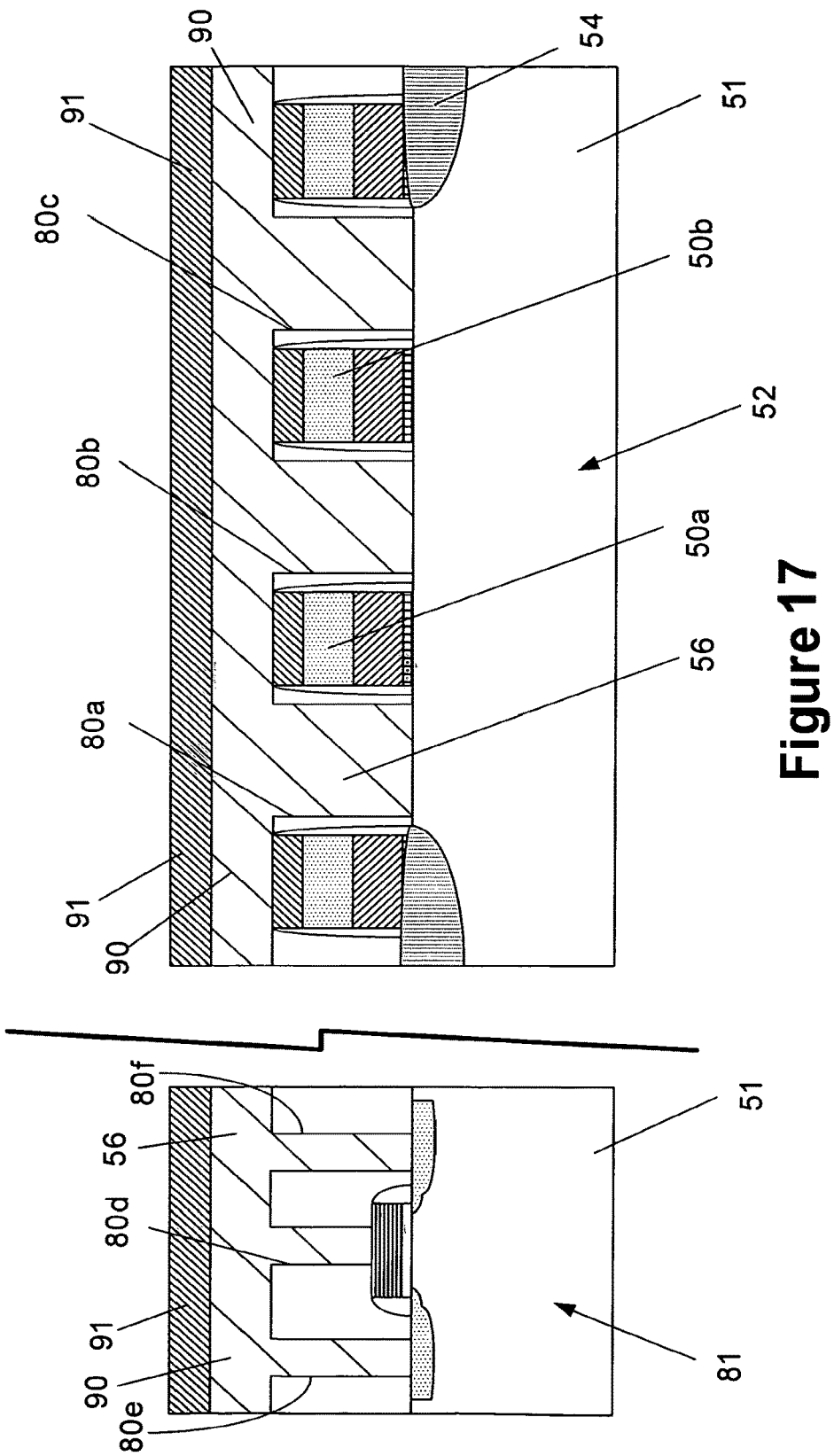
FIGS. 17-18 depict yet another illustrative process flow for filing contact openings formed in accordance with the present invention.
Figure 18:
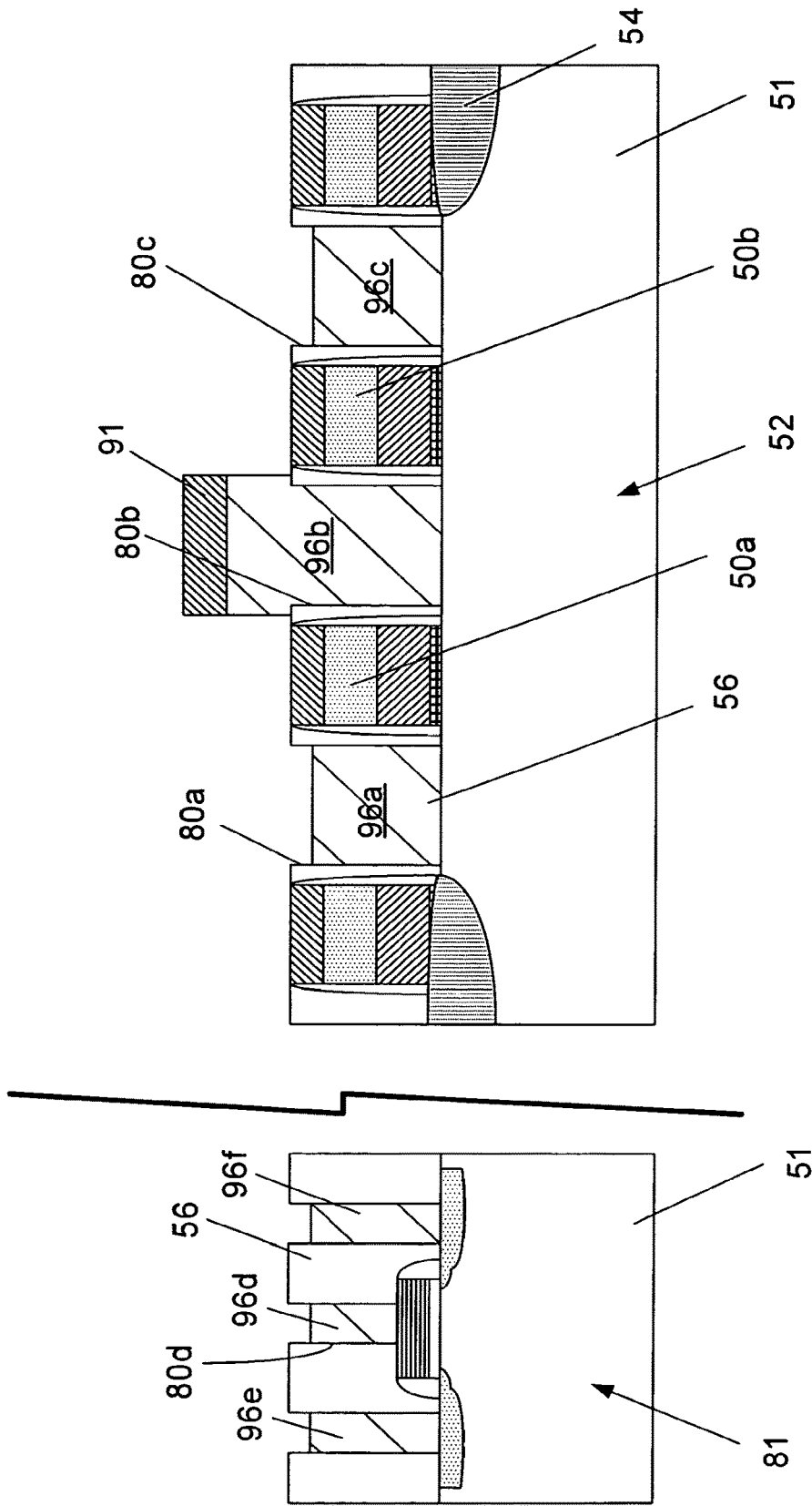

FIGS. 17 and 18 depict another illustrative process flow for forming conductive contacts within the openings 80a, 80b, 80c, 80d, 80e and 80f. As shown in FIG. 17, a conductive layer 90, e.g., tungsten, is blanket deposited across the substrate 51 and in the openings 80a, 80b, 80c, 80d, 80e and 80f. A process layer 91, e.g., a layer of silicon nitride, is formed above the conductive layer 90. Using known photolithography techniques, a masking layer (not shown) comprised of a photoresist material is formed above the process layer 91. Thereafter, one or more anisotropic etching processes are performed to essentially pattern the layers 90 and 91, thereby resulting in the structure depicted in FIG. 18. Note that the etching process may be performed until such time as the conductive layer 90 is recessed within the openings 80a, 80c, 80d, 80e and 80f, thereby defining recessed contact members 96a, 96c, 96d, 96e and 96f. In one illustrative embodiment, the structure 96b is a unitary or integral digitline contact structure that is contacted to the active area 52. The contacts 96a, 96c are portions of storage node contacts for an illustrative dual bit memory cell. Subsequent processing steps (not shown) may be performed to form contacts to the recessed contacts 96a, 96c, 96d, 96e and 96f. Depending upon the particular process flow selected, contact may be made to the recessed contact members 96a, 96c, 96d, 96e and 96f using the same or different conductive material.

Figure 19:
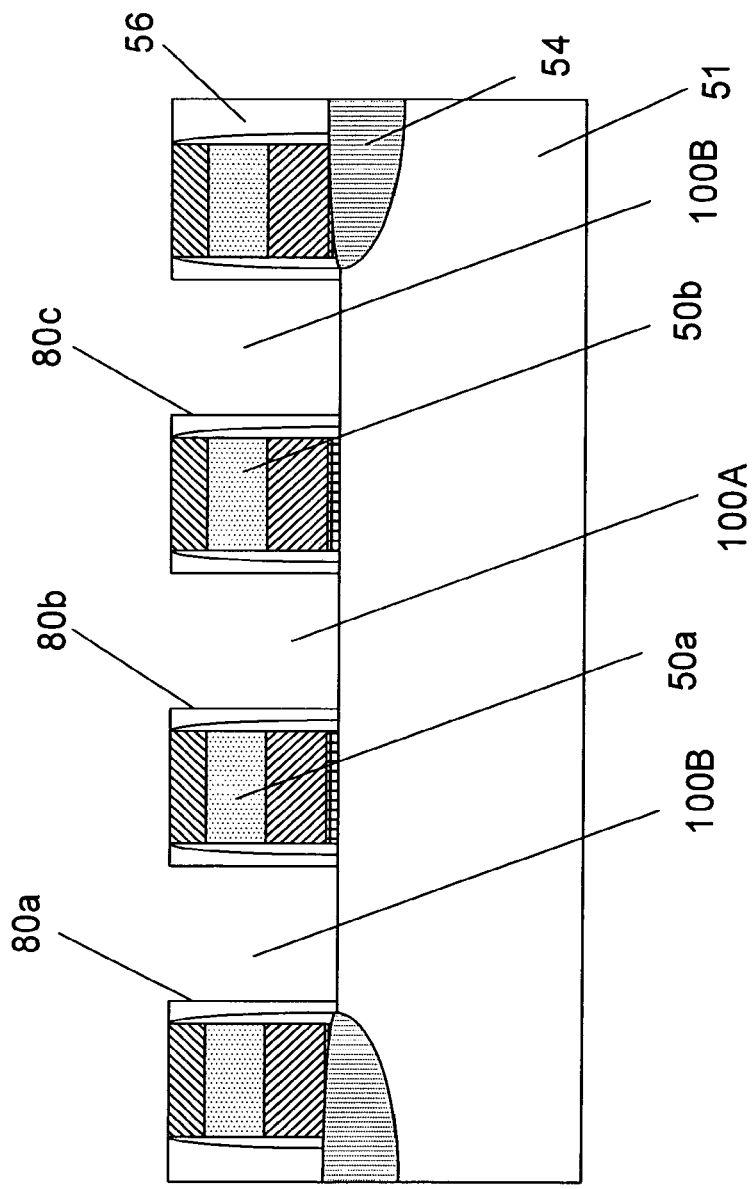
FIGS. 19-22 depict one illustrative technique for forming storage node contacts in accordance with one illustrative aspect of the present invention.
Figure 20:
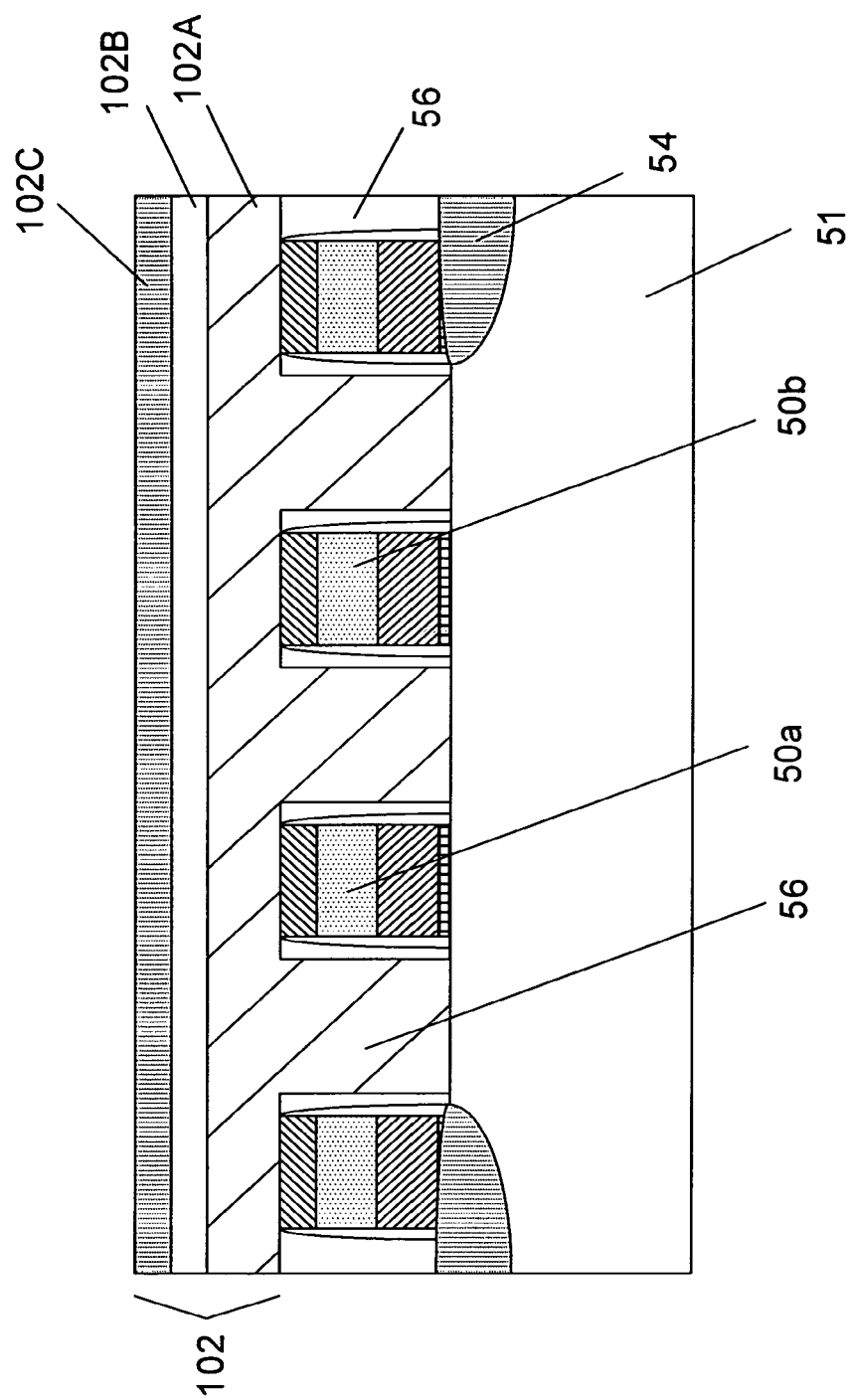

Another aspect of the present invention will now be described with reference to FIGS. 19-24. FIG. 19 depicts the device after the hard mask layer 60b has been employed to define an opening 100A for a digitline contact and two openings 100B for storage node contacts. Next, as shown in FIG. 20, a bit line 102 is formed using traditional deposition techniques. In one illustrative embodiment, the bit line 102 is comprised of a first layer of conductive material 102A, e.g., tungsten, a second layer of conductive material 102B, e.g., titanium, and a cap layer 102C, e.g., silicon nitride. Of course, a variety of different materials may be employed to form the bit line 102.

Figure 21:
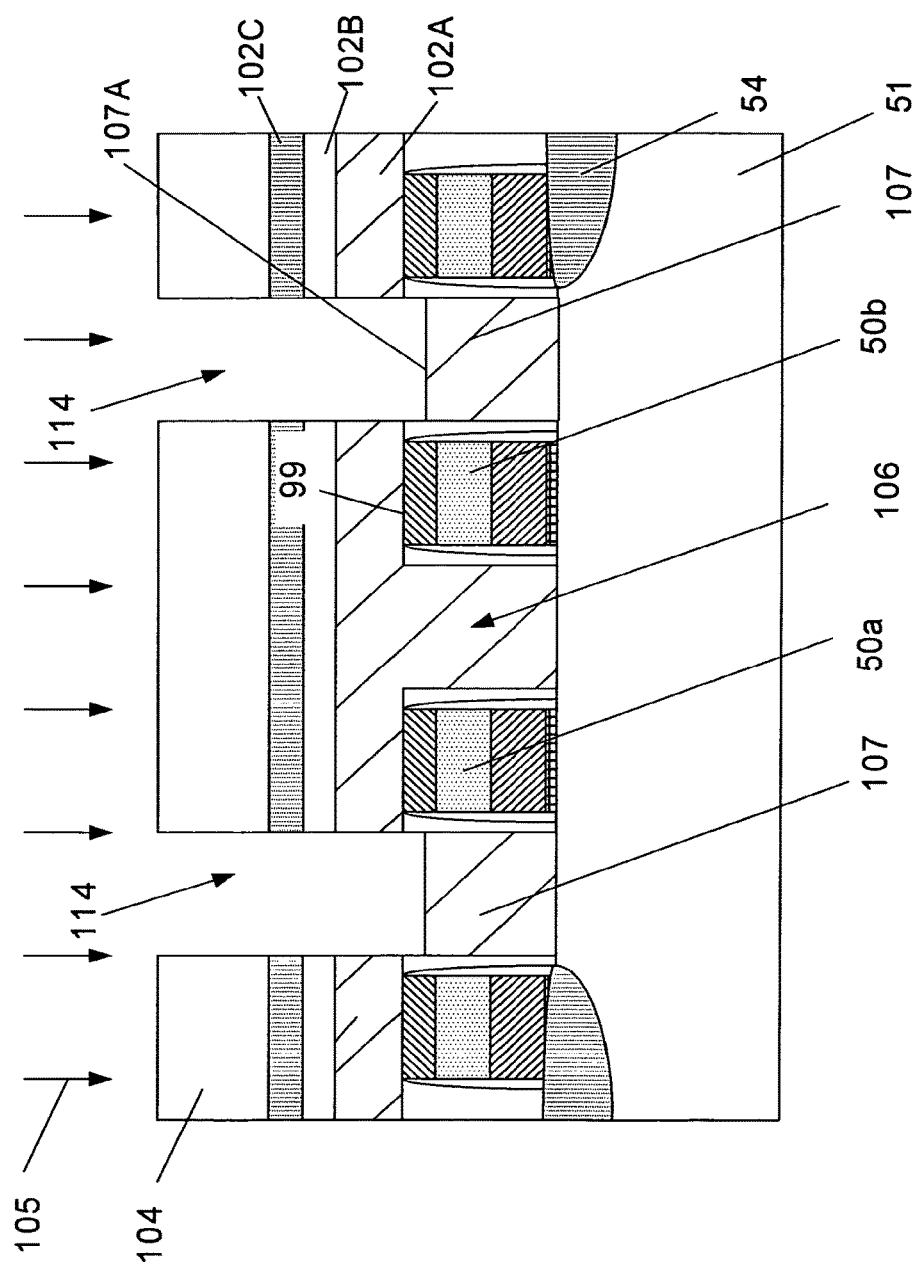

Next, as shown in FIG. 21, a patterned masking layer 104, e.g., photoresist, is formed and an etching process, indicated by arrows 105, is performed to define the digitline contact 106 and a first conductive portion 107 of the storage node contacts. The etching process 105 may be controlled to determine how much the first conductive portions 107 are recessed relative to the upper surface 99 of the word line structures 50*a*, 50*b*.

Figure 22:
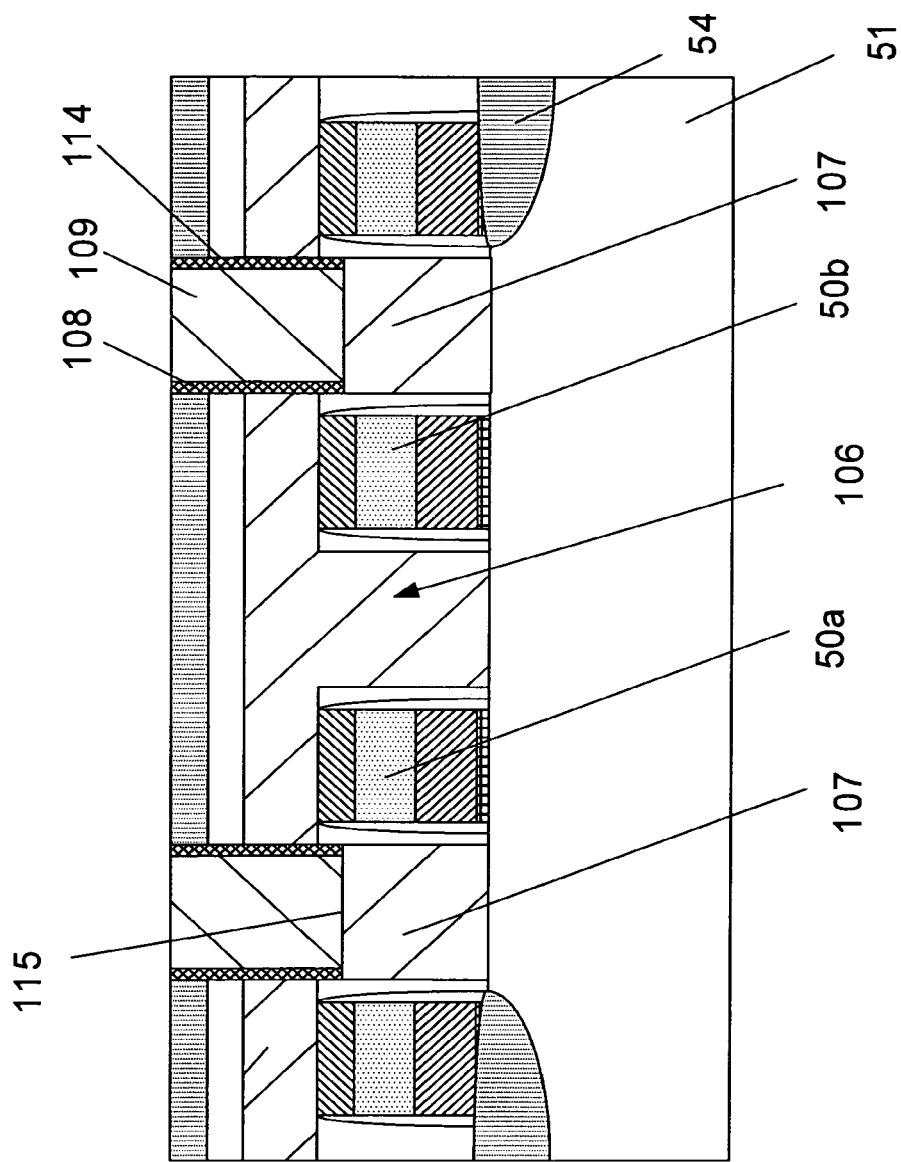

Thereafter, as shown in FIG. 22, a liner 108 is formed in the opening 114. The liner 108 may be formed from a variety of insulating materials, e.g., silicon dioxide, silicon nitride, etc. In one particularly illustrative embodiment, the liner 108 may be comprised of a low-k dielectric material, i.e., a material having a dielectric constant less than 7, i.e., less than the dielectric constant of silicon nitride. For example, the liner 108 may be comprised of TEOS, silicon dioxide. In one embodiment, the liner 108 may have a thickness ranging from 200-400 Å and it may be formed using known conformal deposition techniques followed by an anisotropic etching process to clear the dielectric material from above the upper surface 107A of the first conductive portion 107. Thereafter, the second conductive portion 109 may be formed above the first conductive portion 107. A conductive interface 115 is thereby established between the first conductive portion 107 and the second conductive portion 109. The first and second conductive portions 107, 109 may be formed of the same or different materials. The second conductive portion 109 may be formed by depositing a layer of conductive material, e.g., tungsten, titanium, etc., above the cap layer 102C and in the openings between the liner 108. A planarization process may then be performed to remove excess portions of the conductive material positioned above the cap layer 102C to thereby define the second conductive portions 109.

Figure 23:
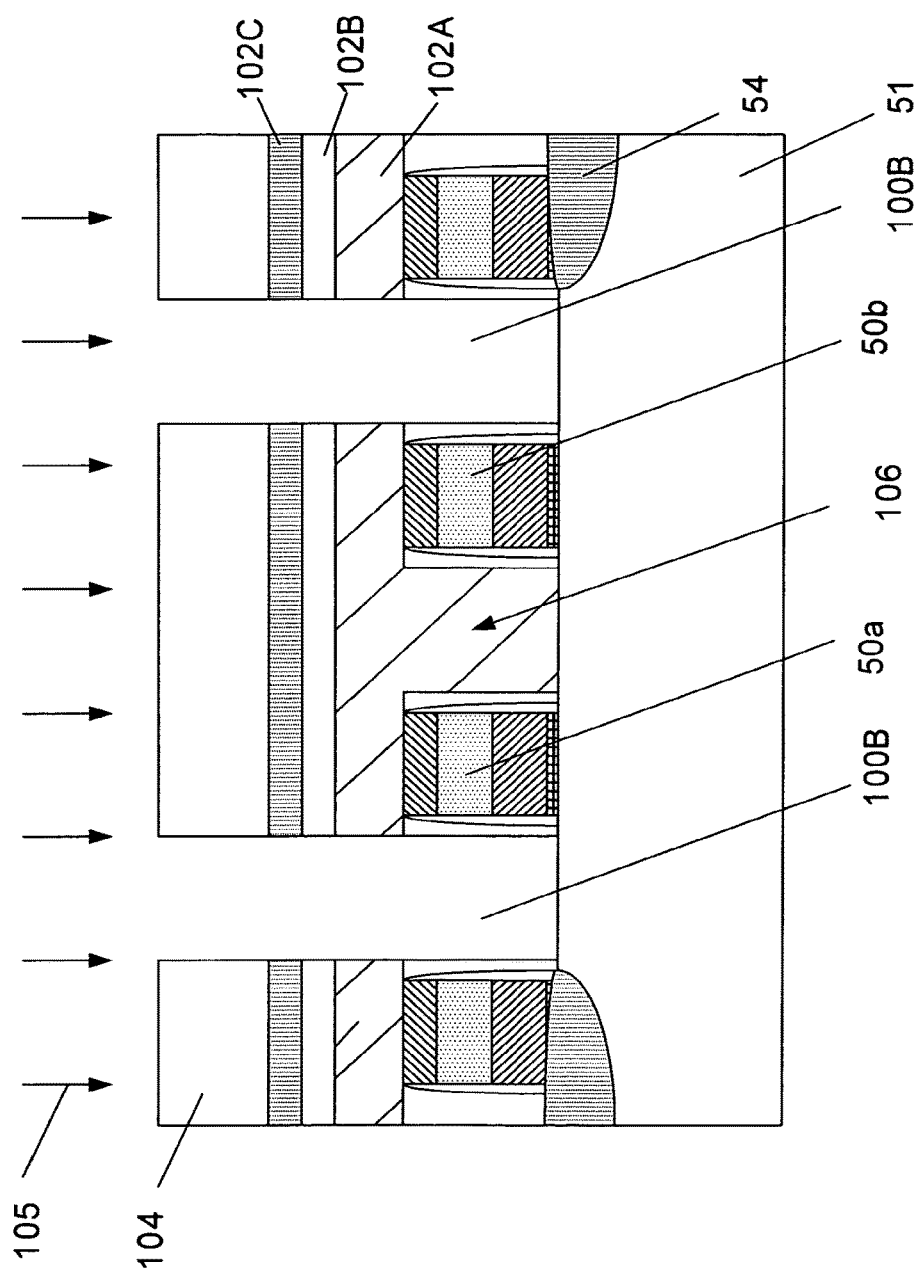
FIGS. 23-24 depict yet another illustrative technique for forming storage node contacts in accordance with one illustrative aspect of the present invention.
Figure 24:
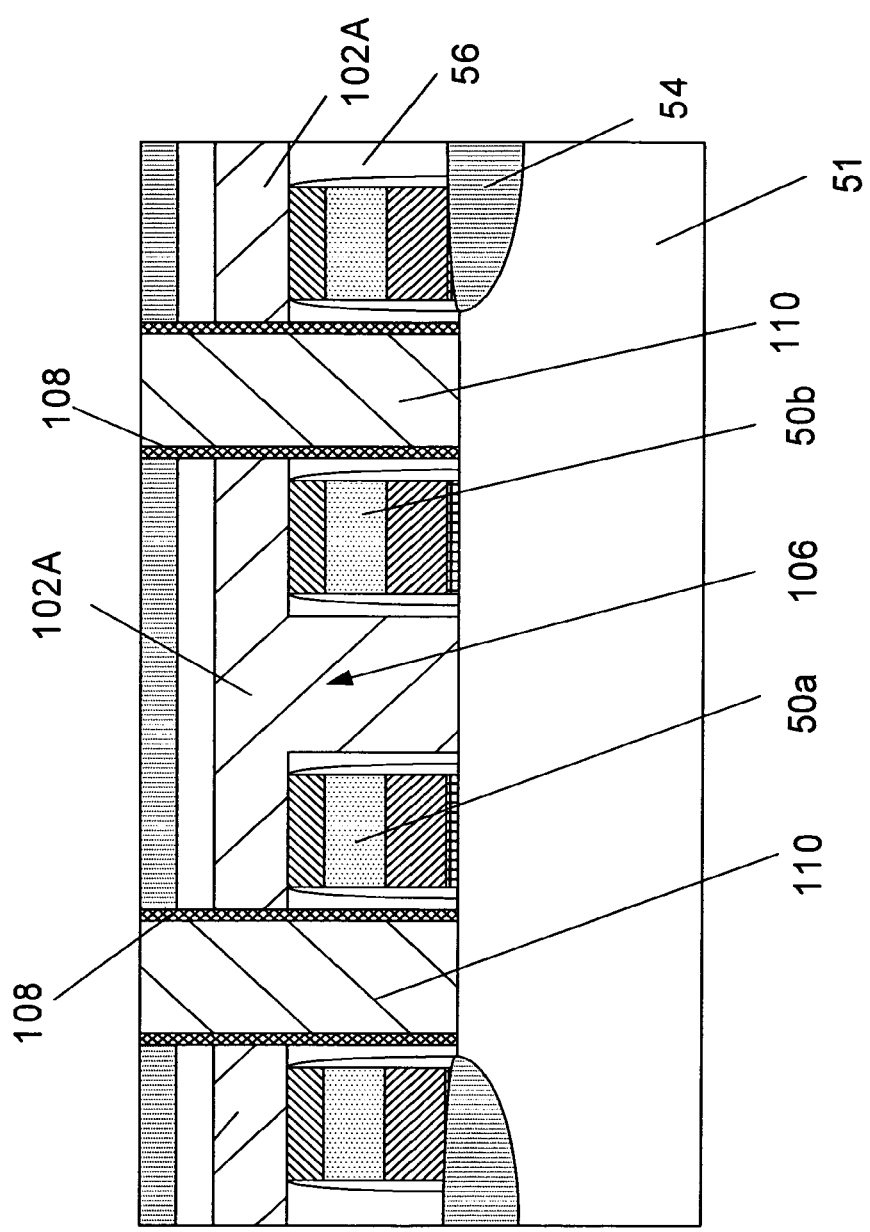

FIGS. 23-24 depict an alternative process flow for an illustrative aspect of the present invention. As shown in FIG. 23, the etching process 105 that is performed to form the digitline contact 106 is continued until such time as the entirety of the conductive material 102A is cleared from the openings 100B for the storage node contacts. Next, as shown in FIG. 24, the liner 108 is formed in the openings 100B and a unitary conductive portion 110 is formed to constitute the storage node contact. The conductive portion 110 may be made of any conductive material, e.g., titanium, tungsten, etc., and it may be the same as or different from the material 102A. The process flow depicted in FIGS. 23-24 provides a continuous storage node contact, as compared to the process flow described in FIGS. 19-22 wherein the storage node contact is comprised of the first and second conductive portions 107, 109. Additionally, in the embodiment depicted in FIGS. 23-24, the liner 108 extends along the entire length of the unitary conductive structure 110, whereas, in the embodiment shown in FIG. 22, the liner 108 extends along the entire length of the second conductive portion 109.

The present invention is generally directed to a method of forming contacts for a memory device. In one illustrative embodiment, the method comprises forming a layer of insulating material above an active area of a dual bit memory cell, forming a hard mask layer above the layer of insulating material, the hard mask layer having an original thickness, performing at least two partial etching processes on the hard mask layer to thereby define a patterned hard mask layer above the layer of insulating material, wherein each of the partial etching processes is designed to etch through less than the original thickness of the hard mask layer, the hard mask layer having openings formed therein that correspond to a digitline contact and a plurality of storage node contacts for the dual bit memory cell, and performing at least one etching process to form openings in the layer of insulating material for the digitline contact and the plurality of storage node contacts using the patterned hard mask layer as an etch mask.

In another illustrative embodiment, the method comprises forming a layer of insulating material above an active area of a dual bit memory cell, forming a hard mask layer above the layer of insulating material, the hard mask layer having an original thickness, performing at least two partial etching processes on the hard mask layer to thereby define a patterned hard mask layer above the layer of insulating material, wherein each of the partial etching processes is designed to etch through less than the original thickness of the hard mask layer, the patterned hard mask layer being comprised of a material that is selectively etchable with respect to the layer of insulating material, the patterned hard mask layer having openings formed therein that correspond to a digitline contact and a plurality of storage node contacts for the dual bit memory cell, and performing a single etching process to form openings in the layer of insulating material for the digitline contact and the plurality of storage node contacts using the patterned hard mask layer as an etch mask.

In yet another illustrative embodiment, the method comprises forming a layer of insulating material above an active area of a dual bit memory cell, depositing a hard mask layer above the layer of insulating material, the hard mask layer having a deposited thickness, performing at least two partial etching processes on the deposited hard mask layer to form a patterned hard mask layer, wherein each of the partial etching processes is designed to etch through less than the entire deposited thickness of the hard mask layer, the hard mask layer having openings formed therein that correspond to a digitline contact and a plurality of storage node contacts for the dual bit memory cell, and performing at least one etching process to form openings in the layer of insulating material for the digitline contact and the plurality of storage node contacts using the patterned hard mask layer as an etch mask.

In a further illustrative embodiment, the method comprises forming a layer of insulating material above an active area of a dual bit memory cell, forming a patterned hard mask layer above the layer of insulating material, the patterned hard mask layer being comprised of a material that is selectively etchable with respect to the layer of insulating material, the hard mask layer having openings formed therein that correspond to a digitline contact, a plurality of storage node contacts for the dual bit memory cell and an opening for a contact located in a peripheral circuit located outside of a memory array comprising the dual bit memory cell, and performing a single etching process to form openings in the layer of insulating material for the digitline contact, the plurality of storage node contacts and the contact for the peripheral circuit using the patterned hard mask layer as an etch mask.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device comprising:
   a word line;
   a storage node contact;

a digit line adjoining the storage node contact; and a liner intervening between the storage node contact and the digit line, wherein the liner comprises a low-k dielectric material having a dielectric constant less than 7.

2. The device of claim 1, further comprising a digit line contact that is in electrical contact with the digit line and extending to an active area of a substrate.

3. The device of claim 2, wherein the active area includes first and second portions, the storage node contact being in electrical contact with the first portion of the active area and the digit line contact being in electrical contact with the second portion of the active area.

4. A memory device comprising:
a word line structure;
a passing word line structure being spaced apart from the word line structure;
a storage node contact;
a digit line extending over the word line structure to adjoin the storage node contact; and
a liner intervening between the storage node contact and the digit line, wherein the liner comprises a low-k dielectric material having a dielectric constant less than 7.

5. The device of claim 4, further comprising a digit line contact that is in electrical contact with the digit line and extends to an active area of a substrate.

6. The device of claim 5 wherein the active area includes first and second portions, the storage node contact being in electrical contact with the first portion of the active area and the digit line contact being in electrical contact with the second portion of the active area.

7. The device of claim 4, wherein each of the word line structure and the passing word line structure comprises:
a conductive layer; and
a top insulating layer disposed over the conductive layer.

8. The device of claim 7, wherein the digit line extends over the top insulating layer of the word line structure.

9. The device of claim 8, further comprising:
a substrate;
an active area in the substrate; and
an isolation region adjoining the active area on the substrate.

10. The device of claim 9, wherein the storage node contact is in electrical contact with a first portion of the active area and the digit line is in electrical contact with the second portion of the active area.

11. The device of claim 10, wherein the word line structure and the passing word line structure are located in the active area and the isolation region, respectively.

12. A memory device comprising:
a substrate including an active area;
a first word line crossing the active area to define in the active area first and second portions;
a digit line contact including electrical contact with the second portion of the active area;
a digit line including electrical contact with the digit line contact and crossing the word line;
a first storage node contact including electrical contact with the first portion of the active area; and
a first liner intervening between the first storage node contact and the digit line, the first liner comprising a low-k dielectric material having a dielectric constant less than 7.

13. The device of claim 12, further comprising;
a second word line crossing the active area in substantially parallel to the first word line to define in the active area the second portion between the first and second word lines and a third portion;
a second storage node contact including electrical contact with the third portion of the active area; and
a second liner intervening between the second storage node contact and the digit line, the second liner comprising a low-k dielectric material having a dielectric constant less than 7.

14. The device of claim 13, wherein the first, second and third portion of the active area are arranged such that the second portion is sandwiched between the first and second portions.

15. The device of claim 12, wherein at least the digit line contract, the digit line and the storage node contact are above a top surface of the substrate.

16. The device of claim 12, wherein the active area is defined by an isolation region embedded, at least in part, into the substrate.

17. The device of claim 16, further comprising a passing word line, the passing word line crossing the isolation region in substantially parallel to the first word line.

18. The device of claim 12, wherein at least the first and second portion of the active area and a part of the first word line cooperate with each other to serve as an access device.

19. The device of claim 18, wherein the access device is a buried type device that is formed in the substrate.

20. The device of claim 19, further comprising an insulating layer over the substrate, the insulating layer including a first opening into which the digit line contact is formed and a second opening into which the storage node contact is formed.

* * * * *